United States Patent
Iftime et al.

(10) Patent No.: US 7,588,878 B2
(45) Date of Patent: Sep. 15, 2009

(54) INKLESS PRINTING PAPER AND METHOD

(75) Inventors: Gabriel Iftime, Mississauga (CA); Tyler B. Norsten, Oakville (CA); Peter M. Kazmaier, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 204 days.

(21) Appl. No.: 11/762,107

(22) Filed: Jun. 13, 2007

(65) Prior Publication Data

US 2008/0311517 A1     Dec. 18, 2008

(51) Int. Cl.
G03F 7/00 (2006.01)
G03F 7/004 (2006.01)

(52) U.S. Cl. .................... 430/270.1; 430/311; 430/905; 430/913; 430/945

(58) Field of Classification Search ........................ None
See application file for complete search history.

(56) References Cited

U.S. PATENT DOCUMENTS

| | | | |
|---|---|---|---|
| 3,825,427 A | 7/1974 | Inoue et al. | |
| 3,877,941 A | 4/1975 | Lohmann | |
| 3,961,948 A | 6/1976 | Saeva | |
| 4,425,161 A | 1/1984 | Shibahashi et al. | |
| 4,598,035 A | 7/1986 | Usami et al. | |
| 4,659,649 A * | 4/1987 | Dickinson et al. | 430/280.1 |
| 4,931,337 A | 6/1990 | Miyazaki et al. | |
| 5,124,236 A | 6/1992 | Yamaguchi et al. | |
| 5,262,280 A | 11/1993 | Knudsen et al. | |
| 5,376,511 A | 12/1994 | Tatezono et al. | |
| 5,458,874 A | 10/1995 | Pereira et al. | |
| 5,677,107 A | 10/1997 | Neckers | |
| 5,691,100 A | 11/1997 | Kudo et al. | |
| 5,691,395 A | 11/1997 | Knudsen et al. | |
| 5,747,225 A | 5/1998 | Manico et al. | |
| 6,067,185 A | 5/2000 | Albert et al. | |
| 6,103,378 A | 8/2000 | Yao et al. | |
| 6,200,646 B1 * | 3/2001 | Neckers et al. | 427/510 |
| 6,528,221 B2 | 3/2003 | Takezawa et al. | |
| 6,579,662 B1 | 6/2003 | Zheng et al. | |
| 6,680,281 B2 | 1/2004 | Tajiri et al. | |
| 6,761,758 B2 * | 7/2004 | Boils-Boissier et al. | 106/31.29 |
| 6,866,981 B2 | 3/2005 | Furukawa et al. | |
| 6,867,408 B1 | 3/2005 | Gu et al. | |
| 6,906,118 B2 | 6/2005 | Goodbrand et al. | |
| 7,018,714 B2 | 3/2006 | Kobayashi et al. | |
| 7,057,054 B2 | 6/2006 | Irie et al. | |
| 7,205,088 B2 | 4/2007 | Iftime et al. | |
| 7,214,456 B2 | 5/2007 | Iftime et al. | |
| 7,229,740 B2 | 6/2007 | Iftime et al. | |
| 7,256,921 B2 * | 8/2007 | Kumar et al. | 359/241 |
| 7,332,257 B2 | 2/2008 | Miyako et al. | |
| 7,381,506 B2 | 6/2008 | Iftime et al. | |
| 7,441,887 B2 | 10/2008 | Senga et al. | |
| 2002/0160318 A1 | 10/2002 | Richter et al. | |
| 2003/0130456 A1 | 7/2003 | Kim et al. | |
| 2005/0012998 A1 * | 1/2005 | Kumar et al. | 359/494 |
| 2005/0244744 A1 | 11/2005 | Kazmaier et al. | |
| 2005/0269556 A1 | 12/2005 | Evans et al. | |
| 2006/0001944 A1 | 1/2006 | Chopra et al. | |
| 2006/0222972 A1 | 10/2006 | Chopra et al. | |
| 2006/0222973 A1 | 10/2006 | Iftime et al. | |
| 2006/0236470 A1 * | 10/2006 | Sabnis et al. | 8/405 |
| 2006/0251988 A1 | 11/2006 | Iftime et al. | |
| 2006/0257785 A1 | 11/2006 | Johnson | |
| 2007/0054215 A1 | 3/2007 | Iftime et al. | |
| 2007/0072110 A1 | 3/2007 | Iftime et al. | |
| 2007/0112103 A1 | 5/2007 | Zhou et al. | |

FOREIGN PATENT DOCUMENTS

| | | |
|---|---|---|
| CA | 2 053 094 A1 | 4/1992 |
| EP | 1 367 111 | 12/2003 |
| EP | 1 405 891 | 4/2004 |
| EP | 1 591 829 | 11/2005 |
| EP | 1 591 831 | 11/2005 |
| FR | 2774998 | 8/1999 |
| GB | 2 430 257 | 3/2007 |
| JP | 57-136645 | 8/1982 |
| JP | A-61-175087 | 8/1986 |
| JP | A-5-265129 | 10/1993 |
| JP | A-11-30835 | 2/1999 |
| JP | A-2002-240441 | 8/2002 |
| JP | A-2002-285146 | 10/2002 |
| JP | A-2003-255489 | 9/2003 |
| JP | A-2003-255490 | 9/2003 |
| JP | A-2004-039009 | 2/2004 |
| JP | A-2004-045037 | 2/2004 |
| JP | A-2004-091638 | 3/2004 |

(Continued)

OTHER PUBLICATIONS

Masamitsu Shirai et al., "Photoacid and Photobase Generators: Chemistry and Applications to Polymeric Materials," *Prog. Polym. Sci.* vol. 21, pp. 1-45 (1996).

(Continued)

*Primary Examiner*—Amanda C. Walke
(74) *Attorney, Agent, or Firm*—Oliff & Berridge, Plc.

(57) ABSTRACT

An image forming medium includes a substrate and an imaging layer coated on or impregnated into the substrate, where the imaging layer includes a photoacid generator and an acid-base indicator. In the image forming medium, irradiation of the imaging layer causes the photoacid generator to generate an acid that reacts with the acid-base indicator to produce an image.

22 Claims, No Drawings

FOREIGN PATENT DOCUMENTS

| | | |
|---|---|---|
| JP | A-2004-149501 | 5/2004 |
| JP | A-2004-256780 | 9/2004 |
| JP | A-2005-082507 | 3/2005 |
| JP | A-2005-250463 | 9/2005 |
| WO | WO 97/31033 | 8/1997 |
| WO | WO 00/016985 A1 | 3/2000 |
| WO | WO 2006/039130 A1 | 4/2006 |
| WO | WO 2008/043853 A2 | 4/2008 |

OTHER PUBLICATIONS

U.S. Appl. No. 11/762,152, filed Jun. 13, 2007, to Iftime et al.
U.S. Appl. No. 11/762,327, filed Jun. 13, 2007, to Iftime et al.
U.S. Appl. No. 11/762,147, filed Jun. 13, 2007, to Iftime et al.
U.S. Appl. No. 11/762,098, filed Jun. 13, 2007, to Iftime et al.
U.S. Appl. No. 11/762,157, filed Jun. 13, 2007, to Iftime et al.
U.S. Appl. No. 11/762,153, filed Jun. 13, 2007, to Iftime et al.
U.S. Appl. No. 11/762,144, filed Jun. 13, 2007, to Kazmaier et al.
U.S. Appl. No. 11/762,150, filed Jun. 13, 2007, to Norsten et al.
U.S. Appl. No. 11/762,107, filed Jun. 13, 2007, to Iftime et al.
U.S. Appl. No. 11/762,176, filed Jun. 13, 2007, to Norsten et al.
U.S. Appl. No. 11/762,307, filed Jun. 13, 2007, to Norsten et al.
U.S. Appl. No. 11/762,159, filed Jun. 13, 2007, to Kazmaier et al.
U.S. Appl. No. 11/762,311, filed Jun. 13, 2007, to Kazmaier et al.
M. Irie, "Diarylethense for Memories and Switches," Chem Reviews, 100, pp. 1685-1716 (2000).
Kentaro Morimitsu et al., "Dithienylethenes With a Novel Photochromic Performance," J. Org. Chem., vol. 67, pp. 4574-4578 (2002).
Wojtyk et al., "Effects of metal ion complexation on the spiropyran-merocyanine interconversion: development of a thermally stable photo-switch," J. Chem. Soc. Chem, Comm., pp. 1703-1704, 1998.
"Dolch Introduces World's First Ruggedized Notebook with Integrated Printer" available at http://news.thomasnet.com/fullstory/7005/447, pp. 1-4, Feb. 6, 2002.
T. Hirose et al., "Self-Assembly of Photochromic Diarylethenes With Amphiphilic Side Chains: Reversible Thermal and Photochemical Control," J. Org. Chem., 71, pp. 7499-7508 (2006).
T. Norsten et al., "Photoregulation of Fluorescence in a Porphyrinic Dithienylethene Photochrome," J. Am. Chem. Soc., 123(8), pp. 1784-1785 (2001).
Vladimir I. Minkin, "Phot-, Thermo-, Solvato-, and Electrochromic Spiroheterocyclic Compounds," Chemical Reviews, 104, 5, pp. 2751-2776 (2004).
Takayuki Suzuki et al., "Stabilization of the merocyanine form of photchromic compounds in fluoro alcohols is due to a hydrogen bond", Chem. Commun., 2685-2686 (1998).
Ronald F.M. Lange et al., "Supramolecular polymer interactions based on the alternating copolymer of styrene and Maleimide" Macromolecules, 28, 782-783 (1995).
Vladimir I. Minkin et al., "Perimidine spirocyclohexa dienones" in Organic Photochromic and Thermochromic Compounds, VI, Plenum Press, pp. 315-340 (1999).
John Biteau et al., "Photochromism of Spirooxazine-Doped Gels," J. Phys. Chem., 100, 9024-9031 (1996).
Leonard J. Prins et al., "Noncovalent Synthesis Using Hydrogen Bonding," Agnew. Chem. Int. Ed., 40, 2382-2426 (2001).
Terry M. Cresp et al., "A Synthesis of $\alpha\beta$-Unsaturated Aldehydes," J. Chem. Soc., Perkin Trans., I, pp. 37-41 (1974).
Elliot Berman et al., "Photochromic Spiropyrans. I. The Effect of Substituents on the Rate of Ring Closure," J. Am. Chem. Soc., 81, 5605-5608 (1959).
Sheng-Hua Liu et al., "Synthesis of Negative Photochromic Crowned Spirobenzopyrans," Syn. Commun., 30, 5, 895-902 (2000).
Yu M. Chunaev et al., "Reaction of the Fischer Base With Nitro- and Bromo-Substituted $\alpha$Hydroxycinnamaldehydes," Chem. Heterocycl. Compd., 628-631 (1984).
Kentaro Morimitsu et al., "Thermal Cycloreversion Reaction of a Photochromic Dithienylperfluorocyclopentene with *tert*-Butoxy Substituents at the Reactive Carbons," The Chemical Society of Japan, 2002, p. 572-573.

* cited by examiner

INKLESS PRINTING PAPER AND METHOD

TECHNICAL FIELD

This disclosure is generally directed to a substrate, method, and apparatus for inkless printing on paper. More particularly, in embodiments, this disclosure is directed to an inkless printing substrates, such as inkless printing paper utilizing a composition that is imageable by UV light, such as comprising a photoacid generator and an acid-base indicator, which composition can be dispersed in a polymer as a dry coating onto or into the substrate. The imaged UV light causes the photoacid generator to generate an acid, which in turn reacts with the acid-base indicator to produce a colored image. Other embodiments are directed to an inkless printing methods using the inkless printing substrates, and apparatus and systems for such printing.

CROSS-REFERENCE TO RELATED APPLICATIONS

Disclosed in commonly assigned U.S. patent application Ser. No. 11/123,163, filed May 6, 2005, is an image forming medium, comprising a polymer, a photochromic compound containing chelating groups embedded in the polymer, and a metal salt, wherein molecules of the photochromic compound are chelated by a metal ion from the metal salt.

Disclosed in commonly assigned U.S. patent application Ser. No. 10/835,518, filed Apr. 29, 2004, is an image forming method comprising: (a) providing a reimageable medium comprised of a substrate and a photochromic material, wherein the medium is capable of exhibiting a color contrast and an absence of the color contrast; (b) exposing the medium to an imaging light corresponding to a predetermined image to result in an exposed region and a non-exposed region, wherein the color contrast is present between the exposed region and the non-exposed region to allow a temporary image corresponding to the predetermined image to be visible for a visible time; (c) subjecting the temporary image to an indoor ambient condition for an image erasing time to change the color contrast to the absence of the color contrast to erase the temporary image without using an image erasure device; and (d) optionally repeating procedures (b) and (c) a number of times to result in the medium undergoing a number of additional cycles of temporary image formation and temporary image erasure.

Disclosed in commonly assigned U.S. patent application Ser. No. 10/834,722, filed Apr. 29, 2004, is a reimageable medium comprising: a substrate; and a photochromic material, wherein the medium is capable of exhibiting a color contrast and an absence of the color contrast, wherein the medium has a characteristic that when the medium exhibits the absence of the color contrast and is then exposed to an imaging light corresponding to a predetermined image to result in an exposed region and a non-exposed region, the color contrast is present between the exposed region and the non-exposed region to form a temporary image corresponding to the predetermined image that is visible for a visible time, wherein the medium has a characteristic that when the temporary image is exposed to an indoor ambient condition for an image erasing time, the color contrast changes to the absence of the color contrast to erase the temporary image in all of the following: (i) when the indoor ambient condition includes darkness at ambient temperature, (ii) when the indoor ambient condition includes indoor ambient light at ambient temperature, and (iii) when the indoor ambient condition includes both the darkness at ambient temperature and the indoor ambient light at ambient temperature, and wherein the medium is capable of undergoing multiple cycles of temporary image formation and temporary image erasure.

Disclosed in commonly assigned U.S. patent application Ser. No. 11/220,803, filed Sep. 8, 2005, is an image forming medium, comprising: a substrate; and an imaging layer comprising a photochromic material and a polymer binder coated on said substrate, wherein the photochromic material exhibits a reversible homogeneous-heterogeneous transition between a colorless state and a colored state in the polymer binder.

Disclosed in commonly assigned U.S. patent application Ser. No. 11/220,572, filed Sep. 8, 2005, is an image forming medium, comprising: a substrate; and a mixture comprising a photochromic material and a solvent wherein said mixture is coated on said substrate, wherein the photochromic material exhibits a reversible homogeneous-heterogeneous transition between a colorless state and a colored state in the solvent.

Disclosed in commonly assigned U.S. patent application Ser. No. 11/123,163, filed May 6, 2005, is an image forming medium, comprising a polymer; and a photochromic compound containing chelating groups embedded in the polymer; and a metal salt; wherein molecules of the photochromic compound are chelated by a metal ion from the metal salt.

Disclosed in commonly assigned U.S. patent application Ser. No. 11/093,993, filed Mar. 20, 2005, is a reimageable medium, comprising: a substrate having a first color; a photochromic layer adjacent to the substrate; a liquid crystal layer adjacent to the photochromic layer, wherein the liquid crystal layer includes a liquid crystal composition; and an electric field generating apparatus connected across the liquid crystal layer, wherein the electric field generating apparatus supplies a voltage across the liquid crystal layer.

Disclosed in commonly assigned U.S. patent application Ser. No. 10/834,529, filed Apr. 29, 2004, is a reimageable medium for receiving an imaging light having a predetermined wavelength scope, the medium comprising: a substrate; a photochromic material capable of reversibly converting among a number of different forms, wherein one form has an absorption spectrum that overlaps with the predetermined wavelength scope; and a light absorbing material exhibiting a light absorption band with an absorption peak, wherein the light absorption band overlaps with the absorption spectrum of the one form.

The entire disclosure of the above-mentioned applications are totally incorporated herein by reference.

BACKGROUND

Inkjet printing is a well-established market and process, where images are formed by ejecting droplets of ink in an image-wise manner onto a substrate. Inkjet printers are widely used in home and business environments, and particularly in home environments due to the low cost of the inkjet printers. The inkjet printers generally allow for producing high quality images, ranging from black-and-white text to photographic images, on a ride range of substrates such as standard office paper, transparencies, and photographic paper.

However, despite the low printer costs, the cost of replacement inkjet cartridges can be high, and sometimes higher than the cost of the printer itself. These cartridges must be replaced frequently, and thus replacement costs of the ink cartridges is a primary consumer complaint relating to inkjet printing.

Reducing ink cartridge replacement costs would thus be a significant enhancement to inkjet printing users.

SUMMARY

The present disclosure addresses these and other needs, in embodiments, by providing an image forming medium utilizing a composition that is imageable by UV light, and which comprises a photoacid generator and an acid-base indicator, which composition can be dispersed in a polymer as a dry coating onto or into the substrate. The imaged UV light causes the photoacid generator to generate an acid, which in turn reacts with the acid-base indicator to produce a colored image. The present disclosure in other embodiments provides an inkless printing methods using the inkless printing substrates, and apparatus and systems for such printing.

The present disclosure thereby provides a printing media, method, and printer system for printing images without using ink or toner. The paper media has a special imageable composition and it is printed with UV light. The paper media thus allows image formation using a printer that does not require ink or toner replacement, and instead images the paper using a UV light source, such as a LED.

In an embodiment, the present disclosure provides an image forming medium, comprising
  a substrate; and
  an imaging layer coated on or impregnated into said substrate, wherein the imaging layer comprises:
    a photoacid generator, and
    an acid-base indicator,
  wherein irradiation of the imaging layer causes said photoacid generator to generate an acid that reacts with the acid-base indicator to produce an image.

In another embodiment, the present disclosure provides a method of making an image forming medium, comprising applying an imaging layer composition to a substrate, wherein the imaging layer composition comprises:
  a photoacid generator, and
  an acid-base indicator,
  wherein irradiation of the imaging layer composition causes said photoacid generator to generate an acid that reacts with the acid-base indicator to produce an image.

In another aspect, the present disclosure provides a method of forming a transient image, comprising:
  providing an image forming medium comprising:
  a substrate; and
  an imaging layer coated on or impregnated into said substrate, wherein the imaging layer comprises a photoacid generator and an acid-base indicator;
  exposing the image forming medium to UV irradiation in an imagewise manner,
  wherein said UV irradiation causes said photoacid generator to generate an acid that reacts with the acid-base indicator to produce an image.

The imaging method can be conducted, for example, using an imaging system, comprising:
  the image forming medium of claim 1; and
  a printer comprising a UV irradiation source for printing on the image forming medium in an imagewise manner.

DETAILED DESCRIPTION OF EXEMPLARY EMBODIMENTS

Generally, in various exemplary embodiments, there is provided an inkless paper or image forming medium formed using a composition that is imageable by UV light, such as comprising a photoacid generator and an acid-base indicator, which composition can be dispersed in a polymer as a dry coating onto or into the substrate. The imaged UV light causes the photoacid generator to generate an acid, such as an organic or an inorganic acid, which in turn reacts with the acid-base indicator to produce a colored image. The composition thus exhibits a transition between a clear state and a colored state in the image forming medium. By a colored state, in embodiments, refers to for example, the presence of visible wavelengths; likewise, by a colorless state, in embodiments, refers to for example, the complete or substantial absence of visible wavelengths.

In embodiments, the image forming medium generally comprises an imaging layer coated on or impregnated in a suitable substrate material, or sandwiched between a first and a second substrate material (i.e., a substrate material and an overcoat layer).

The imaging layer can include any suitable material that, when exposed to an activating energy such as ultraviolet light, switches from a first clear state to a second colored state. The color state change in embodiments can be reversed, and thus the image "erased" and the image forming medium returned to a blank state, by various means such as heating the composition to a temperature that reverses the image forming reaction, thus returning the material to its clear state.

In embodiments, any suitable composition can be used for forming the imaging layer. For example, the imaging layer can comprise a photoacid generator and an acid-base indicator, which composition can be dispersed in a polymer as a dry coating onto or into the substrate. In this composition, the imaged UV light causes the photoacid generator to generate an acid, which in turn reacts with the acid-base indicator to produce a colored image. The active imaging materials can be dispersed in any suitable medium for forming the imaging layer, such as being dispersed in a solvent, a solution, a polymer binder, or the like; being chemically bonded to a carrier such as a polymer binder; provided in the form of microencapsulated materials; incorporated in an enclosed matrix to hold the imaging composition in place; and the like. In embodiments, the image forming reaction can be reversible, although many of the combinations of photoacid generator and acid-base indicator, upon reaction, will form permanent images.

Any suitable photoacid generator can be used, where the photoacid generator is a precursor that generates an acid, which can be an organic or an inorganic acid, when exposed to the activating energy such as UV light. In embodiments, the photoacid generator produces an acid when exposed to UV light, where the acid has a pH<7.

Various suitable photoacid generators are known in the art, and can be used in embodiments herein. Exemplary photoacid generators include halogenated triazines, onium salts such as aryldiazonium salts and diaryl halonium salts, triaryl sulfonic salts, sulfonated esters, substituted hydroxyimides, substituted hydroxylimines, azides, naphthoquinones such as diazonaphthoquinones, diazo compounds, and combinations thereof. Another class of photoacid generator materials is represented by non-ionic photoacid generators, such as nitrobenzyl esters, sulfones, phosphates, and the like. These compounds generally generate an acid by being irradiated with an active energy beam such as UV light. A further review of photoacid and photobase generators can be found, for example, in Prog. Polym. Sci. vol. 21, 1-45, 1996, the entire disclosure of which is incorporated herein by reference.

Useful halogenated triazines include, for example, halogenated alkyl triazines such as the trihalomethyl-s-triazines.

Useful onium salts include onium salts with weakly nucleophilic anions. Examples of such anions are the halogen complex anions of divalent to heptavalent metals or nonmetals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to, diazonium salts such as diaryl-diazonium salts and onium salts of group VA and B, IIA and B and I of the Periodic Table, for example, halonium salts such as iodonium salts, quaternary ammonium, phosphonium and arsonium salts, sulfonium salts such as aromatic sulfonium salts, sulfoxonium salts or selenium salts. Sulfonium salts such as triphenylsulfonium hexafluorophosphate and mixtures thereof are typical.

The sulfonated esters useful as photoacid generators include, for example, sulfonyloxy ketones. Suitable sulfonated esters include, but are not limited to, benzoin tosylate, t-butylphenyl alpha-(p-toluenesulfonyloxy)-acetate, 2,6-dinitrobenzyl tosylate, and t-butyl alpha-(p-toluenesulfonyloxy)-acetate.

Substituted hydroxyimides that may be used include, for example, n-trifluoromethylsulfonyloxy-2,3-diphenylmaleimide and 2-trifluoromethylbenzenesulfonyloxy-2,3-diphenylmaleimide. Suitable substituted hydroxylimines include, for example, 2-(-nitrilo-2-methylbenzylidene)-(5-hydroxyiminobutylsulfonyl)-thiophene. Azides include, for example, 2,6-(4-azidobenzylidene)cyclohexanone. Naphthoquinones may include, for example, 2,1-diazonaphthoquinone-4-sulfonate ester of 2,3,4-trihydroxybenzophenone. Among the diazo compounds, 1,7-bis(4-chlorosulonyl phenyl)-4-diazo-3,5-heptanedione may be used.

By way of example only, other specific suitable organic based photoacid generators include dialkylphenacyl sulfonium tetrafluoroborate, bis(4-tert-butylpheny)iodonium perfluoro-1-butanesulfonate; bis(4-tert-butylphenyl)iodonium p-toluenesulfonate; bis(4-tert-butylpheny)iodonium triflate; (4-bromophenyl)diphenylsulfonium triflate; (tert-butoxycarbonylmethoxynaphthyl)-diphenylsulfan triflate; (tert-butoxycarbonylmethoxpheny)diphenysulfonium triflate; (4-tert-butylphenyl)diphenylsulfonium triflate; (4-chlorophenyl)diphenylsulfonium triflate; diphenyliodonium hexafluorophosphate; diphenyliodonium nitrate; diphenyliodonium perfluoro-1-butanesulfonate; diphenyliodonium p-toluenesulfonate; diphenyliodonium triflate; (4-fluorophenyl)diphenylsulfonium triflate; N-hydroxynaphthalimide triflate; N-hydroxy-5-norbornene-2,3-dicarboximide perfluoro-1-butanesulfonate; N-hydroxyphthalimide triflate; (4-iodophenyl)diphenylsulfonium triflate); (4-methoxyphenyl)diphenylsulfonium triflate; (4-methylphenyl)diphenylsulfonium triflate; (4-methylthiophenyl)methyl phenyl sulfonium triflate; 2-naphthyl diphenylsulfonium triflate; (4-phenoxyphenyl)diphenylsulfonium triflate; (4-phenylthiophenyl)diphenylsulfonium triflate; triphenylsulfonium perfluoro-1-butanesulfonate; triphenylsulfonium triflate; tris(4-tert-butylphenyl)sulfonium perfluoro-1-butanesulfonate; and tris(4-tert-butylphenyl)sulfonium triflate.

An illustrative example of a suitable photoacid generator is shown below, depicted using dialkylphenacyl sulfonium tetrafluoroborate as the photoacid generator:

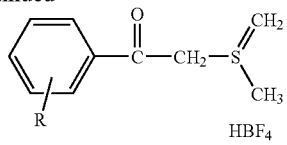

where R represents an alkyl group. With this compound, the generated acid is HBF$_4$.

In addition, a suitable photosensitizer may optionally be used in combination with the photoacid generator to expand the photosensitize wavelength band of the active energy beam of the photoacid generator. Various photosensitizers are well known in the art, and can be used in embodiments. Examples of the photosensitizers include benzophenone, and the like. However, in embodiments, a photosensitizer is desirably omitted, to provide a narrow wavelength band of the active energy beam to help prevent accidental activation of the imaging materials.

Any suitable acid-base indicator can also be used, where the acid-base indicator reacts with the acid generated from the photoacid generator to produce a colored image. In embodiments, the reaction of the acid-base indicator with the acid generated from the photoacid generator causes the image forming layer at the reaction site to change from a clear or colorless state to a colored state, or from a first colored state to a second, different colored state, with the degree and/or color of the change being related to the type of materials reacting and the relative amount of material reacting.

Various suitable acid-base indicators are known in the art, and can be used in embodiments herein. Various acid-base indicators are generally readily available and are well-known in the art, being used in analytical labs worldwide for acid-base titrations. In general, any acid-base indicator that produces a significant enough color change when switching between the protonated and deprotonated states is suitable. Exemplary acid-base indicators include picric acid, methyl yellow, matius yellow, 2,6-dinitrophenol, 2,4-dinitrophenol, phenacetolin, 2,5-dinitrophenol, isopicramic acid, o-nitrophenol, m-nitrophenol, p-nitrophenol, 6,8-dinitro-2,4-(1H, 3H)quinazolinedione, nitroamine, ethyl bis(2,4-dinitrophenyl)-acetate, 2,4,6-trinitrotoluene, 1,3,5-trinitrobenzene, 2,4, 6-tribromobenzoic acid, 2-(p-dimethylaminophenyl) azopyridine, metanil yellow, p-methyl red, 4-phenylazodiphenylamine, benzopurpurin 4B, tropaeolin OO, fast garnet GBC base, alizarin yellow R, benzyl orange, m-methyl red, 4-(m-tolyl)-azo-N,N-dimethyl-aniline, oil yellow II, methyl orange (sodium p-dimethylamino azo benzene sulfonate), ethyl orange, hessian purple N, congo red, N-pnehyl-1-naphthyl-aminoazobenzene-p-sulfonic acid, 4-(4'-dimethylamino-1'-naphthyl)-azo-3-methoxy-benzene-sulfonic acid, p-ethoxychrysoidine, .alpha.-naphthyl red, chrysoidine, 1-naphthylaminoazobenzene-p-sulfonic acid, methyl red, 2-(p-dimethylaminophenyl)-azopyridine, ethyl red, propyl red, N-phenyl-1-naphthyl-aminoazo-o-carboxybenzene, nitrazol yellow, brilliant yellow, brilliant yellow S, orange II, propyl-o-naphthyl orange, orange I, orange IV, hessian, Bordeaux, diazo violet, .alpha.-naphthol violet, alizarin yellow GG, chrome orange GR, sulfone acid blue R, lanacyl violet BF, tropaeolin O, orange G, crystal violet, methyl violet B, malachite green, brilliant green, ethyl violet, methyl violet 6B, ethyl/methyl green, basic fuchsine, acid, fuchsine, patent blue V, alkali blue, bromphenol blue, aniline blue, o-naphthol benzein, pentamethoxy red, hexamethoxy red, tetrabromophenolphthalein ethyl ester K salt, tetraiodophenolsulfophthlein, bromochlorophenol blue, bromocresol green, chlorocresol green, chlorophenol red, bromocresol purple, sulfonaphthyl red, bromophenol red, dibromophenol-tetrabromophenol-sulfophthlein, bromothymol blue, aurin, phenol red, o-cresol benzein, o-cresol red, .alpha.-naphtholphthlein, m-cresol purple, p-xylenol blue, thymol blue, phenoltetrachlorophthlein, o-cresolphthalein, .alpha.-naphtholbenzein, phenoltetraiodophthlein, phenolphthalein, thymolphthlein, eosin Y, erythrosine B, erythrosine, galleon, brilliant cresyl blue, resazurin, lacmoid, litmus, azolitmus, azolitmin, neutral red, nile blue 2B, nile blue A, hematoxylin, quinaldine red, pinachrome, indo-oxine, quinoline blue, bis-5-bromovanillidenecyclohexanone, bis-(2'-hydroxystyryl)ketone, curcumin, bis-(4-hydroxy-3-ethoxy-benzylidene)-cyclohexanone, thiazole yellow G, alizarin blue B, alizarin red S, carminic acid, alizarin orange, alizarin, rufianic acid, rufianic blue, alizarin blue SWR, indigo carmine, and mixtures thereof.

As a representative example, it is shown here the chemical coloration-discoloration reaction for a well known acid indicator, methyl red:

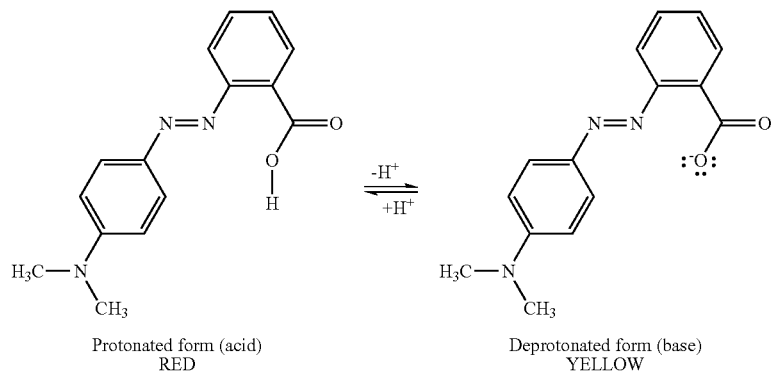

Protonated form (acid)
RED

Deprotonated form (base)
YELLOW

As a representative example, it is shown here that when the reaction involves Methyl Red, when it is placed on a white paper substrate, the colorless or first colored state (base form) provides a yellow state to the paper, while the colored or second colored state (acid form) provides a red image to the paper.

It will be appreciated that with the suitable selection of acid-base indicators, it is possible to produce any color in the image forming medium. For example, suitable acid-base indicators can be selected to provide colors ranging from yellow, to red, to blue, to purple. Furthermore combinations of two or more indicators may be used to provide a wider range of colors. For example, black or full color images can be provided by selecting combinations of acid-base indicators, such as acid-base indicators that provide cyan, magenta, and yellow colors.

For example, in embodiments, the following acid-base indicators can provide varying colorless and colored states.

| Acid-base indicator | First color state | Second color state | pH range of color change |
| --- | --- | --- | --- |
| Methyl violet | Blue | Yellow | ~0.5-2.5 |
| Thymol blue | Yellow | Red | ~2.0-2.5 |
|  | Violet | Yellow | ~8.5-9.5 |

-continued

| Acid-base indicator | First color state | Second color state | pH range of color change |
| --- | --- | --- | --- |
| Methyl yellow | Yellow | Red | ~3.5-4.0 |
| Bromphenol blue | Blue | Yellow | ~3.0-4.0 |
| Methyl orange | Yellow | Red | ~3.5-4.0 |
| Methyl red | Yellow | Red | ~5.5-6.0 |
| litmus | Violet | Red | ~7.0 |
| Bromthymol blue | Blue | Yellow | ~6.5-7.0 |
| Phenol red | Red | Yellow | ~7.0-8.0 |
| Phenolphthalein | Red | Colorless | ~8.0-9.0 |
| Thymolphthalein | Blue | Colorless | ~10.0 |
| Alizarin yellow | Red | Yellow | ~10.5-11.5 |

Photoacid generators and acid-base indicators are usually effective when present in small amounts in the image forming compositions of the disclosure, but their content is not particularly limited. For example, in embodiments, the photoacid generators and acid-base indicators are each generally present in amounts of from about 0.01% to about 20% by weight, such as from about 0.5% to about 10% by weight or from about 0.8% to about 8% by weight, of the total dry weight of the composition (i.e., excluding any volatile solvents used for applying the composition).

The image forming materials (photoacid generator and acid-base indicator) may be dispersed in any suitable carrier, such as solvent, polymer binder, or the like. Suitable solvents include, for example, straight chain aliphatic hydrocarbons, branched chain aliphatic hydrocarbons, and the like, such as where the straight or branched chain aliphatic hydrocarbons have from about 1 to about 30 carbon atoms. For example, a non-polar liquid of the ISOPAR™ series (manufactured by the Exxon Corporation) may be used as the solvent. These hydrocarbon liquids are considered narrow portions of isoparaffinic hydrocarbon fractions. For example, the boiling range of ISOPAR G™ is from about 157° C. to about 176° C.; ISOPAR H™ is from about 176° C. to about 191° C.; ISOPAR K™ is from about 177° C. to about 197° C.; ISOPAR L™ is from about 188° C. to about 206° C.; ISOPAR M™ is from about 207° C. to about 254° C.; and ISOPAR V™ is from about 254.4° C. to about 329.4° C. Other suitable solvent materials include, for example, the NORPAR™ series of liquids, which are compositions of n-paraffins available from Exxon Corporation, the SOLTROL™ series of liquids available from the Phillips Petroleum Company, and the SHELLSOL™ series of liquids available from the Shell Oil Company. Mixtures of one or more solvents, i.e., a solvent system, can also be used, if desired. In addition, more polar solvents can also be used, if desired. Examples of more polar solvents that may be used include halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate, dimethylformamide, cyclohexanone, N-methyl acetamide and the like. The solvent may be composed of one, two, three or more different solvents. When two or more different solvents are present, each solvent may be present in an equal or unequal amount by weight ranging for example from about 5% to 90%, particularly from about 30% to about 50%, based on the weight of all solvents.

Both compositions dispersable in either organic polymers or waterborne polymers can be used, depending on the used components. For example, for waterborne compositions, polyvinylalcohol is a suitable application polymer and polymethylmethacrylate is suitable for organic soluble compositions.

Suitable examples of polymeric binders include, but are not limited to, polyalkylacrylates like polymethyl methacrylate (PMMA), polycarbonates, polyethylenes, oxidized polyethylene, polypropylene, polyisobutylene, polystyrenes, poly (styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, poly(methacrylic acid), poly[1-2-(hydroxyethyl)aziridine0], poly(N-hydroxyethyl)ethyleneimine, poly(ethyleneimine), poly (N-acetyl) ethyleneimine, poly(acrylamide), poly allylamine, poly(sodium styrene sulfonate) and the like. Copolymer materials such as polystyrene-acrylonitrile, polyethylene-acrylate, vinylidenechloride-vinylchloride, vinylacetate-vinylidene chloride, styrene-alkyd resins, poly(acrylamide-co-acrylic acid), are also examples of suitable binder materials. The copolymers may be block, random, or alternating copolymers. In some embodiments, polymethyl methacrylate or a polystyrene is the polymer binder, in terms of their cost and wide availability.

In embodiments, the imaging composition can be applied in one form, and died to another form for use. Thus, for example, the imaging composition comprising photoacid generator, acid-base indicator, and polymer particles may be dissolved or dispersed in a solvent for application to or impregnation into a substrate, with the solvent being subsequently evaporated to form a dry layer.

In general, the imaging composition can include the carrier and imaging material in any suitable amounts, such as from about 5 to about 99.5 percent by weight carrier, such as from about 30 to about 70 percent by weight carrier, and from about 0.05 to about 50 percent by weight imaging material, such as from about 0.1 to about 5 percent imaging material by weight.

For applying the imaging layer to the image forming medium substrate, the image forming layer composition can be applied in any suitable manner. For example, the image forming layer composition can be mixed and applied with any suitable solvent or polymer binder, and subsequently hardened or dried to form a desired layer. Further, the image forming layer composition can be applied either as a separate distinct layer to the supporting substrate, or it can be applied so as to impregnate into the supporting substrate.

The image forming medium may comprise a supporting substrate, coated or impregnated on at least one side with the imaging layer. As desired, the substrate can be coated or impregnated on either only one side, or on both sides, with the imaging layer. When the imaging layer is coated or impregnated on both sides, or when higher visibility of the image is desired, an opaque layer may be included between the supporting substrate and the imaging layer(s) or on the opposite side of the supporting substrate from the coated imaging layer. Thus, for example, if a one-sided image forming medium is desired, the image forming medium may include a supporting substrate, coated or impregnated on one side with the imaging layer and coated on the other side with an opaque layer such as, for example, a white layer. Also, the image forming medium may include a supporting substrate, coated or impregnated on one side with the imaging layer and with an opaque layer between the substrate and the imaging layer. If a two-sided image forming medium is desired, then the image forming medium may include a supporting substrate, coated or impregnated on both sides with the imaging layer, and with at least one opaque layer interposed between the two coated imaging layers. Of course, an opaque supporting substrate, such as conventional paper, may be used in place of a separate supporting substrate and opaque layer, if desired.

Any suitable supporting substrate may be used. For example, suitable examples of supporting substrates include, but are not limited to, glass, ceramics, wood, plastics, paper, fabrics, textile products, polymeric films, inorganic substrates such as metals, and the like. The plastic may be for example a plastic film, such as polyethylene film, polyethylene terephthalate, polyethylene naphthalate, polystyrene, polycarbonate, polyethersulfone. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. In embodiments, the substrate has a thickness ranging for example from about 0.3 mm to about 5 mm, although smaller or greater thicknesses can be used, if desired.

When an opaque layer is used in the image forming medium, any suitable material may be used. For example, where a white paper-like appearance is desired, the opaque layer may be formed from a thin coating of titanium dioxide, or other suitable material like zinc oxide, inorganic carbonates, and the like. The opaque layer can have a thickness of, for example, from about 0.01 mm to about 10 mm, such as about 0.1 mm to about 5 mm, although other thicknesses can be used.

If desired, a further overcoating layer may also be applied over the applied imaging layer. The further overcoating layer may, for example, be applied to further adhere the underlying layer in place over the substrate, to provide wear resistance, to improve appearance and feel, and the like. The overcoating layer can be the same as or different from the substrate material, although in embodiments at least one of the overcoating layer and substrate layer is clear and transparent to permit visualization of the formed image. The overcoating layer can have a thickness of, for example, from about 0.01 mm to about 10 mm, such as about 0.1 mm to about 5 mm, although other thicknesses can be used.

In embodiments where the imaging material is coated on or impregnated into the substrate, the coating can be conducted by any suitable method available in the art, and the coating method is not particularly limited. For example, the imaging material can be coated on or impregnated into the substrate by dip coating the substrate into a solution of the imaging material composition followed by any necessary drying, or the substrate can be coated with the imaging composition to form a layer thereof. Similarly, the protective coating can be applied by similar methods.

In its method aspects, the present disclosure involves providing an image forming medium comprised of a substrate and an imaging layer comprising a photoacid generator and an acid-base indicator, which composition can be dispersed in a polymer as a dry coating onto or into the substrate. The imaged UV light causes the photoacid generator to generate an acid, which in turn reacts with the acid-base indicator to produce a colored image.

In a writing process, the image forming medium is exposed to an imaging light having an appropriate activating wavelength, such as a UV or visible light source such as a light emitting diode (LED), in an imagewise fashion. The imaging light supplies sufficient energy to the photoacid generator to cause the photoacid generator to generate an acid, which in turn reacts with the acid-base indicator to produce a colored image at the imaging location. The amount of energy irradiated on a particular location of the image forming medium can affect the intensity or shade of color generated at that location. Thus, for example, a weaker intensity image can be formed by delivering a lesser amount of energy to the location and thus generating a lesser amount of acid, while a stronger intensity image can be formed by delivering a greater amount of energy to the location and thus generating a greater amount of acid. When suitable acid-base indicators are selected to provide a black image, the variation in the amount of energy irradiated on a particular location of the image forming medium can thus allow for formation of grayscale images, while selection of other suitable acid-base indicators can allow for formation of full color images.

The imaging light used to form the transient image may have any suitable predetermined wavelength scope such as, for example, a single wavelength or a band of wavelengths. In various exemplary embodiments, the imaging light is an ultraviolet (UV) light having a single wavelength or a narrow band of wavelengths selected from the UV light wavelength range of about 200 nm to about 475 nm, such as a single wavelength at about 365 nm or a wavelength band of from about 360 nm to about 370 nm. For forming the image, the image forming medium may be exposed to the imaging light for a time period ranging from about 10 milliseconds to about 5 minutes, particularly from about 30 milliseconds to about 1 minute. The imaging light may have an intensity ranging from about 0.1 mW/cm$^2$ to about 100 mW/cm$^2$, particularly from about 0.5 mW/cm$^2$ to about 10 mW/cm$^2$.

In various exemplary embodiments, imaging light corresponding to the predetermined image may be generated for example by a computer or a Light Emitting Diode (LED) array screen and the image is formed on the image forming medium by placing the medium on or in proximity to the LED screen for the desired period of time. In other exemplary embodiments, a UV Raster Output Scanner (ROS) may be used to generate the UV light in an image-wise pattern. This embodiment is particularly applicable, for example, to a printer device that can be driven by a computer to generate printed images in an otherwise conventional fashion. That is, the printer can generally correspond to a conventional inkjet printer, except that the inkjet printhead that ejects drops of ink in the imagewise fashion can be replaced by a suitable UV light printhead that exposes the image forming medium in an imagewise fashion. In this embodiment, the replacement of ink cartridges is rendered obsolete, as writing is conducted using a UV light source. Other suitable imaging techniques that can be used include, but are not limited to, irradiating a UV light onto the image forming medium through a mask, irradiating a pinpoint UV light source onto the image forming medium in an imagewise manner such as by use of a light pen, and the like.

In embodiments, the image formed by the exposure to UV light is permanent, much like a conventional ink printed document. That is, the reaction of the formed base with the acid-base indicator is not reversible in the image forming medium, and thus the image can not be erased by a reverse reaction. However, it is envisioned that suitable selection of the photoacid generator and acid-base indicator may be selected such that the reaction can be reversed and the image erased, such as by application of heat, light, or the like.

According to various exemplary implementations, the color contrast that renders the image visible to an observer may be a contrast between, for example two, three or more different colors. The term "color" may encompass a number of aspects such as hue, lightness and saturation, where one color may be different from another color if the two colors differ in at least one aspect. For example, two colors having the same hue and saturation but are different in lightness would be considered different colors. Any suitable colors such as, for example, red, white, black, gray, yellow, cyan, magenta, blue, and purple, can be used to produce a color contrast as long as the image is visible to the naked eye of a user. However, in terms of desired maximum color contrast, a desirable color contrast is a dark gray or black image on a light or white background, such as a gray, dark gray, or black image on a white background, or a gray, dark gray, or black image on a light gray background.

In various exemplary embodiments, the color contrast may change such as, for example, diminish during the visible time, but the phrase "color contrast" may encompass any degree of color contrast sufficient to render an image discernable to a user regardless of whether the color contrast changes or is constant during the visible time.

An example is set forth hereinbelow and is illustrative of different compositions and conditions that can be utilized in practicing the disclosure. All proportions are by weight unless otherwise indicated. It will be apparent, however, that the disclosure can be practiced with many types of compositions and can have many different uses in accordance with the disclosure above and as pointed out hereinafter.

EXAMPLES

Example 1

Yellow Background, Red Image

An image forming medium is made by coating an imaging composition on a paper substrate. The imaging composition is formed by mixing methyl-red as acid-base indicator and dialkylphenacyl sulfonium tetrafluoroborate as photoacid generator, dissolved in a water-alcohol polyvinylalcohol solution. The water-alcohol solution ensures solubility of all components. Initially, the paper is yellow (neutral or basic pH). Exposure to UV light generate the acid. The UV light is produced from an UV LED printbar. The produced acid reacts with the acid-base indicator producing the compound responsible for the red coloration. The printed image is stable (permanently printed) on the paper.

Example 2

Blue Background, Yellow Image

An image forming medium is made as in Example 1, except that bromthymol blue is used in place of methyl red as the acid-base indicator. Initially, the paper is blue (neutral or basic pH). After UV exposure, the produced acid reacts with the acid-base indicator producing the compound responsible for the yellow coloration. The printed image is stable (permanently printed) on the paper.

Example 3

Multicolor Image

An image forming medium is made as in Example 1, except that methyl violet is used in place of methyl red as the acid-base indicator. Methyl violet can show various colors, as a function of the pH. For example, methyl violet can be violet (pH>2) but can also show blue, green and yellow at pH<2. After UV exposure at different exposure levels to generate different acid amounts, the printed image exhibits violet, blue, green, and yellow portions that are stable (permanently printed) on the paper.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. An image forming medium, comprising
   a substrate; and
   an imaging layer coated on or impregnated into said substrate, wherein the imaging layer comprises:
      a photoacid generator, and
      an acid-base indicator,
   wherein the photoacid generator and the acid-base indicator are selected so that irradiation of the imaging layer causes said photoacid generator to generate an acid that reacts with the acid-base indicator to produce a permanent image.

2. The image forming medium of claim 1, wherein the imaging layer further comprises a film-forming material, and said photoacid generator and said acid-base indicator are dispersed in the film-forming material.

3. The image forming medium of claim 2, wherein the film-forming medium is selected from the group consisting of a solvent, a polymer binder, microcapsules, a liquid crystal material, and a matrix material.

4. The image forming medium of claim 2, wherein the film-forming medium is a polymer binder selected from the group consisting of polyalkylacrylates, polycarbonates, polyethylenes, oxidized polyethylene, polypropylene, polyisobutylene, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, polystyrene-acrylonitrile, polyethylene-acrylate, vinylidenechloride-vinyichloride, vinylacetate-vinylidene chloride, styrene-alkyd resins, poly(methacrylic acid), poly[1-2-(hydroxyethyl)aziridine], Poly(N-hydroxyethyl)ethyleneimine, poly(ethyleneimine), poly (N-acetyl) ethyleneimine, poly(acrylamide), poly allylamine, poly (sodium styrene sulfonate), and mixtures thereof.

5. The image forming medium of claim 1, wherein the photo acid generator is selected from the group consisting of halogenated triazines, onium salts, triaryl sulfonic salts, sulfonated esters, substituted hydroxyimides, substituted hydroxylimines, azides, naphthoquinones, diazo compounds, nitrobenzyl esters, sulfones, phosphates, and mixtures thereof.

6. The image forming medium of claim 1, wherein the acid-base indicator is selected from the group consisting of picric acid, methyl yellow, matius yellow, 2,6-dinitrophenol, 2,4-dinitrophenol, phenacetolin, 2,5-dinitrophenol, isopicramic acid, o-nitrophenol, m-nitrophenol, p-nitrophenol, 6,8-dinitro-2,4-(1H,3H)quinazolinedione, nitroamine, ethyl bis(2,4-dinitrophenyl)-acetate, 2,4,6-trinitrotoluene, 1,3,5-trinitrobenzene, 2,4,6-tribromobenzoic acid, 2-(p-dimethylaminophenyl)azopyridine, metanil yellow, p-methyl red, 4-phenylazodiphenylamine, benzopurpurin 4B, tropaeolin OO, fast garnet GBC base, alizarin yellow R, benzyl orange, m-methyl red, 4-(m-tolyl)-azo-N,N-dimethyl-aniline, oil yellow II, methyl orange (sodium p-dimethylamino azo benzene sulfonate), ethyl orange, hessian purple N, congo red, N-pnehyl-1-naphthyl-aminoazobenzene-p-sulfonic acid, 4-(4'-dimethylamino-1'-naphthyl)-azo-3-methoxy-benzene-sulfonic acid, p-ethoxychrysoidine, α-red, chrysoidine, 1-naphthylaminoazobenzene-p-sulfonic acid, methyl red, 2-(p-dimethylaminophenyl)-azopyridine, ethyl red, propyl red, N-phenyl-1-naphthyl-aminoazo-o-carboxybenzene, nitrazol yellow, brilliant yellow, brilliant yellow S, orange II, propyl-o-naphthyl orange, orange I, orange TV, hessian, Bordeaux, diazo violet, α-naphthol violet, alizarin yellow GG, chrome orange GR, sulfone acid blue R, lanacyl violet BF, tropaeolin O, orange G, crystal violet, methyl violet B, malachite green, brilliant green, ethyl violet, methyl violet 6B, ethyl/methyl green, basic fuchsine, acid, fuchsine, patent blue V, alkali blue, bromophenol blue, aniline blue, o-naphthol benzene, pentamethoxy red, hexamethoxy red, tetrabromophenolphthalein ethyl ester K salt, tetraiodophenolsulfophthlein, bromochlorophenol blue, bromocresol green, chlorocresol green, chlorophenol red, bromocresol purple, sulfonaphthyl red, bromophenol red, dibromophenol-tetrabromophenol-sulfophthlein, bromothymol blue, aurin, phenol red, o-cresol benzene, o-cresol red, α-naphtholphthlein, m-cresol purple, p-xylenol blue, thymol blue, phenoltetrachlorophthlein, o-cresolphthalein, α-naphtholbenzene, phenoltetraiodophthlein, phenolphthalein, thymolphthlein, eosin Y, erytbrosine B, erythrosine, galleon, brilliant cresyl blue, resazurin, lacmoid, litmus, azolitmus, azolitmin, neutral red, nile blue 2B, nile blue A, hematoxylin, quinaldine red, pinachrome, indo-oxine, quinoline blue, bis-5-bromovanillidenecyclohexanone, bis-(2'-hydroxystyryl)ketone, curcumin, bis-(4-hydroxy-3-ethoxy-benzylidene)-cyclohexanone, thiazole yellow G, alizarin blue B, alizarin red S, carminic acid, alizarin orange, alizarin, rufianic acid, rufianic blue, alizarin blue SWR, indigo carmine, and mixtures thereof.

7. The image forming medium of claim 1, wherein the acid-base indicator provides an imaging layer that is exhibits a first color prior to exposure to irradiation and exhibits a second color, different from the first color, after irradiation.

8. The image forming medium of claim 1, wherein the photoacid generator and the acid-base indicator are selected such that said image is selected from the group consisting of a monochrome image, a grayscale image, and a multicolor image.

9. The image forming medium of claim 1, wherein the irradiation causes said photoacid generator to generate an inorganic acid.

10. The image forming medium of claim 1, wherein the imaging layer further comprises a photosensitizer.

11. The image forming medium of claim 1, wherein the photoacid generator and the acid-base indicator is each present in an amount of from about 0.01% to about 20% by weight of a total dry weight of the imaging layer.

12. The image forming medium of claim 1, wherein the substrate is selected from the group consisting of glass, ceramic, wood, plastic, paper, fabric, textile, metals, plain paper, and coated paper.

13. The image forming medium of claim 1, further comprising a protective overcoating layer over the imaging layer.

14. A method of making an image forming medium, comprising applying an imaging layer composition to a substrate, wherein the imaging layer composition comprises:
a photoacid generator, and
an acid-base indicator,
wherein the photoacid generator and the acid-base indicator are selected so that irradiation of the imaging layer composition causes said photoacid generator to generate an acid that reacts with the acid-base indicator to produce a permanent image.

15. The method of claim 14, wherein the applying comprises coating the imaging layer over the substrate or impregnating the imaging layer into the substrate.

16. The method of claim 14, wherein the imaging layer composition further comprises a film-forming polymer binder.

17. A method of forming a transient image, comprising:
providing an image forming medium comprising:
a substrate; and
an imaging layer coated on or impregnated into said substrate, wherein the imaging layer comprises a photoacid generator and an acid-base indicator;
exposing the image forming medium to UV irradiation in an imagewise manner,
wherein the photoacid generator and the acid-base indicator are selected so that said UV irradiation causes said photoacid generator to generate an acid that reacts with the acid-base indicator to produce a permanent image.

18. The method of claim 17, wherein the exposing is for a time period ranging from about 10 milliseconds to about 5 minutes at an intensity ranging from about 0.1 mW/cm$^2$ to about 100 mW/cm$^2$.

19. An imaging system, comprising:
the image forming medium of claim 1; and
a printer comprising a UV irradiation source for printing on the image forming medium in an imagewise manner.

20. The image forming medium of claim 1, wherein the image forming medium is an inkless printing paper.

21. The image forming medium of claim 1, wherein the imaging layer is configured to form cyan, magenta, and yellow colors.

22. The image forming medium of claim 1, wherein the imaging layer is configured to form a black color.

* * * * *